United States Patent
Kim et al.

(10) Patent No.: US 7,227,220 B2
(45) Date of Patent: Jun. 5, 2007

(54) SEMICONDUCTOR DEVICES HAVING BURIED BIT LINES AND METHODS OF MANUFACTURING SEMICONDUCTOR DEVICES HAVING BURIED BIT LINES

(75) Inventors: Tae-yong Kim, Gyeonggi-do (KR); Choong-ho Lee, Gyeonggi-do (KR); Chul Lee, Seoul (KR); Eun-suk Cho, Gyeonggi-do (KR); Suk-kang Sung, Seoul (KR); Hye-jin Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/240,544

(22) Filed: Sep. 30, 2005

(65) Prior Publication Data

US 2006/0131613 A1 Jun. 22, 2006

(30) Foreign Application Priority Data

Dec. 17, 2004 (KR) .................. 10-2004-0107993

(51) Int. Cl.
*H01L 29/792* (2006.01)

(52) U.S. Cl. .................. 257/324; 257/208; 257/209; 257/390; 257/391; 257/E29.309

(58) Field of Classification Search .............. 257/208, 257/209, 390, 391, E29.309, 324
See application file for complete search history.

(56) References Cited

U.S. PATENT DOCUMENTS 5,023,680 A * 6/1991 Gill et al. .................. 257/317
6,057,580 A * 5/2000 Watanabe et al. .......... 257/396
6,548,861 B2 4/2003 Palm et al.
6,855,591 B2 * 2/2005 Kim .......................... 438/221
2002/0024092 A1 * 2/2002 Palm et al. ................. 257/330
2003/0006428 A1 * 1/2003 Palm et al. ................. 257/200
2003/0143808 A1 7/2003 Jang .......................... 438/257
2003/0235078 A1 12/2003 Chien et al. ........... 365/185.17

FOREIGN PATENT DOCUMENTS

JP        2004-095904          3/2004
KR     1020020073960 A         9/2002

OTHER PUBLICATIONS

Philips Research-Embedded non-volatile memories. http://www.research.com/technologies/ics/nymemories/, 2004-2005.
Notice to Submit a Response for Korean Patent Application No. 10-2004-0107993 mailed on Feb. 28, 2006.

* cited by examiner

*Primary Examiner*—Minhloan Tran
*Assistant Examiner*—Eduardo A. Rodela
(74) *Attorney, Agent, or Firm*—Myers, Bigel, Sibley & Sajovec, P.A.

(57) ABSTRACT

A semiconductor device includes a semiconductor substrate having a first conductivity type and having an upper portion, a pair of bit lines extending in a first direction and doped with an impurity of a second conductivity type opposite to the first conductivity type and spaced from one another in the upper portion of the semiconductor substrate, a first line formed between the pair of bit lines having a plurality of alternating recessed device isolation regions and channel regions, with each of the channel regions contacting each bit line of the at least one pair of bit lines, and word lines formed at right angles to the first lines and covering the channel regions.

17 Claims, 11 Drawing Sheets

SEMICONDUCTOR DEVICES HAVING BURIED BIT LINES AND METHODS OF MANUFACTURING SEMICONDUCTOR DEVICES HAVING BURIED BIT LINES

PRIORITY CLAIM AND CROSS REFERENCE TO RELATED APPLICATION

This application claims priority under 35 U.S.C. § 119 to Korean Patent Application No. 10-2004-0107993, filed on Dec. 17, 2004, in the Korean Intellectual Property Office, the disclosure of which is incorporated herein by reference in its entirety.

FIELD OF THE INVENTION

The present invention relates to semiconductor devices and methods of manufacturing semiconductor devices, and more particularly to semiconductor devices having buried bit lines and methods of manufacturing semiconductor devices having buried bit lines.

BACKGROUND

In a semiconductor device such as a non-volatile memory device having buried bit lines, an impurity may be selectively doped in upper portions of a semiconductor substrate to form buried bit lines in the substrate which are spaced uniformly from one another. A buried bit line formed directly in a semiconductor substrate may require minimal space.

FIG. 1 is a plan view of a conventional NOR device with a SONOS structure having buried bit lines. Bit lines 12 are formed in upper portions of a semiconductor substrate 10 doped with an impurity of a first conductivity type, e.g., a P-type impurity, by selectively doping the substrate with an impurity, e.g., an N-type impurity, of a second conductivity type opposite to that of the semiconductor substrate 10. Bit lines 12 may have a higher net doping concentration than substrate 10 and may be spaced uniformly from one another while extending in a first direction (e.g. the Y-axis direction indicated in FIG. 1). The bit lines 12 may have a stripe pattern. The word lines 14 may be formed at right angles to the bit lines 12. The word lines 14 may be spaced uniformly from one another and may cover portions of the semiconductor substrate 10 and the bit lines 12. The word lines 14 may be shaped as stripes and may cover channel regions 16 formed in the upper portions of the semiconductor substrate 10 and source/drain regions 18 formed in the bit lines 12. Bit line contacts 20 for external electrical connection may be formed at one end of the bit lines 12.

In some conventional semiconductor devices having buried bit lines, device isolation of the bit lines 12 is performed by PN junctions between the bit lines and the semiconductor substrate 10, which have opposite conductivity types. However, as semiconductor devices are miniaturized, punch-through (i.e. a breakdown due to overlapping junction depletion regions) may occur at the PN junction, resulting in a loss of device isolation. That is, as the distance between adjacent bit lines is reduced in an effort to make devices smaller, the effectiveness of PN junction isolation as a means to isolate adjacent devices may be reduced.

Furthermore, with the high integration of semiconductor devices, the gate channel length is decreased. This may result in several problems, such as a short channel effects, microscopic pattern formation, and restricted operating speed. In particular, various short channel effects may become a serious problem. For example, an increased electric field around the drain region may cause punch-through that penetrates to the potential barrier around a source region. Also, thermo-electrons may cause avalanche breakdown, and a vertical electric field may decrease the vertical mobility of carriers.

SUMMARY

According to some embodiments of the invention, a semiconductor device includes a semiconductor substrate having a first conductivity type, a pair of bit lines extending in a first direction and doped with an impurity of a second conductivity type opposite to the first conductivity type and spaced from one another in an upper portion of the semiconductor substrate, a first line formed between the pair of bit lines having a plurality of alternating recessed device isolation regions and channel regions, with each of the channel regions contacting each bit line of the at least one pair of bit lines, and word lines formed at right angles to the first lines and covering the channel regions.

In some embodiments of the invention, the first conductivity type is P-type and the second conductivity type is N-type.

In some embodiments of the invention, the recessed isolation regions may isolate the at least one pair of bit lines from one another. The recessed isolation regions may further isolate adjacent pairs of channel regions from one another.

In some embodiments of the invention, each of the channel regions includes an upper surface and a pair of opposing sidewalls. An ONO layer is formed on the sidewalls and on the upper surface of the channel region, and a gate electrode is formed on the ONO layer. In some embodiments, the ONO layer and the gate electrode layer extend onto the upper surfaces of adjacent bit lines. The device isolation regions may be filled with HDP oxide and may extend into the substrate.

Some embodiments of the invention include an insulating layer formed in the recess regions and covering surface portions of each of the bit lines. A bit line contact may be formed through the insulating layer for providing electrical contact to at least one of the bit lines.

In some embodiments of the invention, a filling layer is formed partially filling each of the recess regions, and the ONO layer is at least partially formed on the filling layer. The filling layer may include an HDP oxide, TEOS, USG or a PECVD oxide.

Some embodiments of the invention provide a unit cell of a semiconductor memory device having a semiconductor substrate, a pair of bit lines doped with an impurity having conductivity type opposite to that of the substrate and spaced from one another in the upper portion of the semiconductor substrate, a channel region between the pair of bit lines, the channel region having an upper surface and a pair of opposing side surfaces, a pair of recess regions adjacent the opposing side surfaces of the channel region and separating the pair of bit lines on either side of the channel region, an ONO layer formed on the bit lines and the upper and side surfaces of the channel region, and a gate electrode formed on the ONO layer above the upper surface and side surfaces of the channel region.

In some embodiments, the unit cell may have an insulating layer formed in the recess regions and covering surface portions of each of the bit lines, and a bit line contact extending through the insulating layer for providing electrical contact to at least one of the bit lines.

Some embodiments of the invention include a filling layer partially filling each of the recess regions, wherein the ONO layer is at least partially formed on the filling layer. The filling layer may include an HDP oxide, TEOS, USG or a PECVD oxide.

According to some embodiments of the invention, methods of forming a semiconductor device include forming a plurality of bit lines spaced from one another and extending in a first direction in an upper portion of a semiconductor substrate having a first conductivity type, by selectively doping an upper portion of the substrate with an impurity of a second conductivity type that is opposite to first conductivity type. A mask layer is formed on a surface of the semiconductor substrate above the upper portion of the substrate, and a plurality of spaced apart recess regions are formed between the bit lines. The recess regions may extend through the mask layer and into the substrate.

Methods according to the invention further include depositing a first filling layer in the recess regions, removing the mask layer to expose the surface of the semiconductor substrate, partially removing the first filling layer from the semiconductor substrate, to form a second filling layer exposing sidewalls of the recess regions. The first filling layer may include an HDP oxide, TEOS, USG or a PECVD oxide. An ONO layer is formed on the surface of the semiconductor substrate including the sidewalls of the recess regions and the second filling layer, and a gate electrode layer is formed on the ONO layer over the sidewalls of the recess regions extending between adjacent pairs of bit lines. Accordingly, in some embodiments, the channel width may be determined by the height of the second filling layer.

In some embodiments, forming a plurality of spaced apart recess regions defines a plurality of channel regions extending between adjacent pairs of bit lines. The ONO layer covers the plurality of channel regions.

In some embodiments, forming the recess regions includes forming a photoresist pattern for defining the recess regions on the mask layer, and partially removing the mask layer and the semiconductor substrate in the shape of the photoresist pattern to form the recess regions.

In some embodiments, the ONO layer may serves as an etch stop layer when forming the gate electrode.

Some embodiments of the invention further include forming an insulating layer in the recess regions and extending onto the bit lines, and forming a bit line contact in the insulating layer for an external electrical connection to one end of the bit line.

In some embodiments according to the invention, methods of forming a semiconductor device include forming bit lines spaced from one another and extending in a first direction in an upper portion of a semiconductor substrate of a first conductivity type by selectively doping portions of the upper portion of the substrate with an impurity of a second conductivity type that is opposite to first conductivity type, forming a plurality of spaced apart recess regions extending between the bit lines and into the substrate, each of the recess regions having at least a pair of opposing sidewalls extending between a pair of adjacent bit lines, partially filling the recess region with a filling layer, blanket coating an ONO layer on the surface of the semiconductor substrate including the filling layer and sidewalls of the recess regions, and forming a gate electrode layer on the ONO layer over the opposing sidewalls of the recess regions.

Some embodiments of the invention may provide semiconductor devices with an increased channel area and/or a higher device density by overcoming the restrictions of using PN junctions for device isolation between buried bit lines.

Some embodiments of the invention may provide methods of manufacturing a semiconductor device with an increased channel area and/or a higher device density by overcoming the restrictions of using PN junctions for device isolation between buried bit lines.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS ACCORDING TO THE INVENTION

Figure 1:
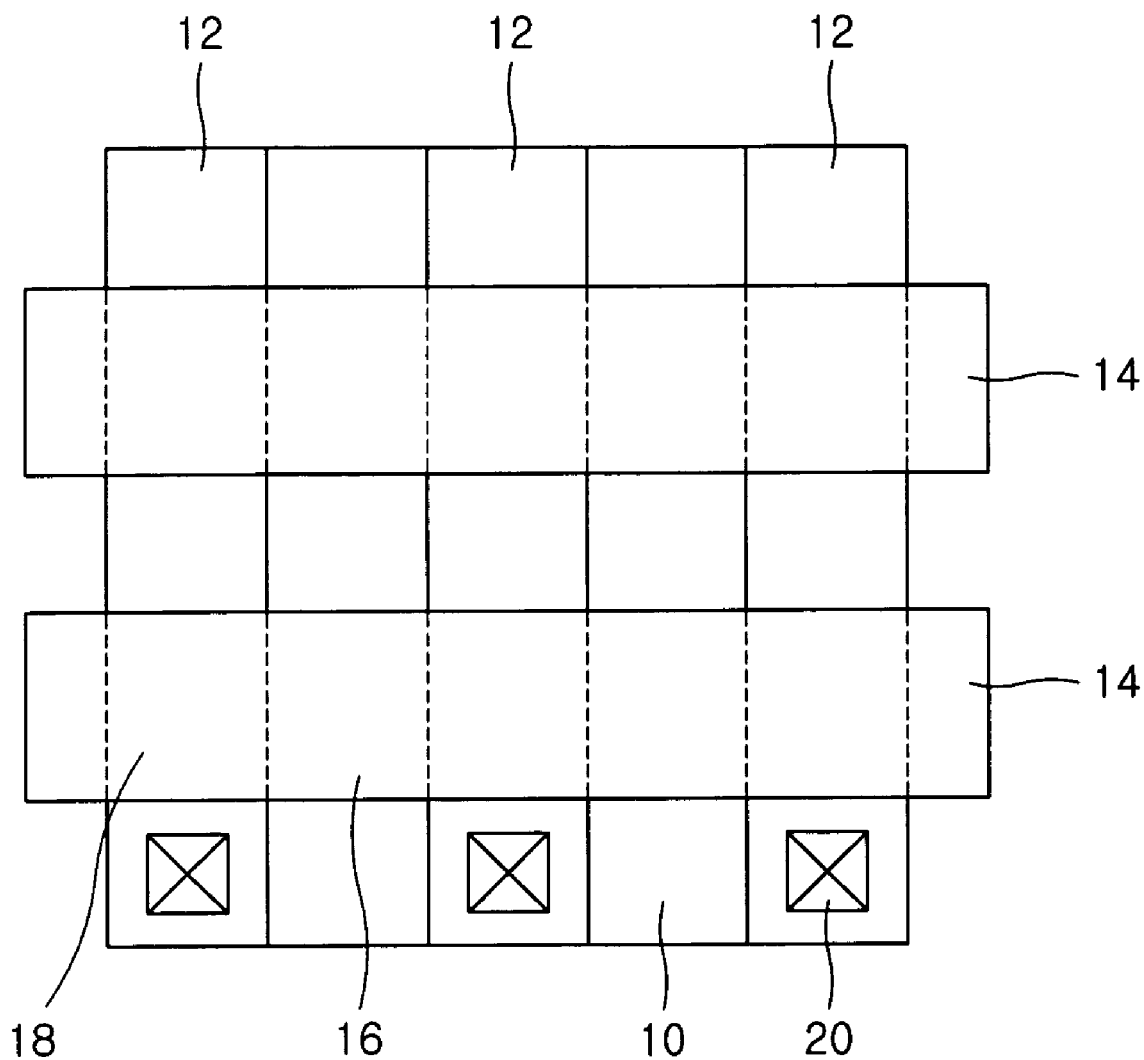
FIG. 1 is a plan view of a conventional NOR device with a SONOS structure having buried bit lines.
Figure 1:
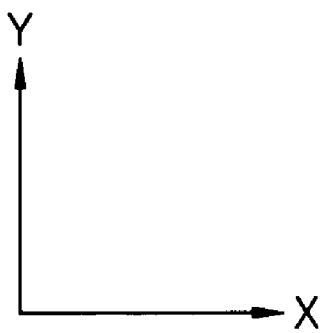

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" or "connected to" another element or layer, it can be directly on or directly connected to the other element or layer or intervening elements or layers may be present.

Like reference numerals refer to like elements throughout. As used herein the term "and/or" includes any and all combinations of one or more of the associated listed items.

It will be understood that, although the terms first, second, etc. may be used herein to describe various elements, components or layers, these elements, components or layers should not be limited by these terms. These terms are only used to distinguish one element, component or layer from another element, component or layer. Thus, a first element, component or layer discussed below could be termed a second element, component or layer without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It will also be appreciated by those of skill in the art that references to a structure or feature that is disposed "adjacent" another feature may have portions that overlap or underlie the adjacent feature.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, elements or components, but do not preclude the presence or addition of one or more other features, elements or components.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The embodiments are described with reference to a non-volatile memory device with a SONOS structure. However, the present invention is not limited to a non-volatile memory device with a SONOS structure, and can be employed in various structures by those skilled in the art.

Figure 2A:
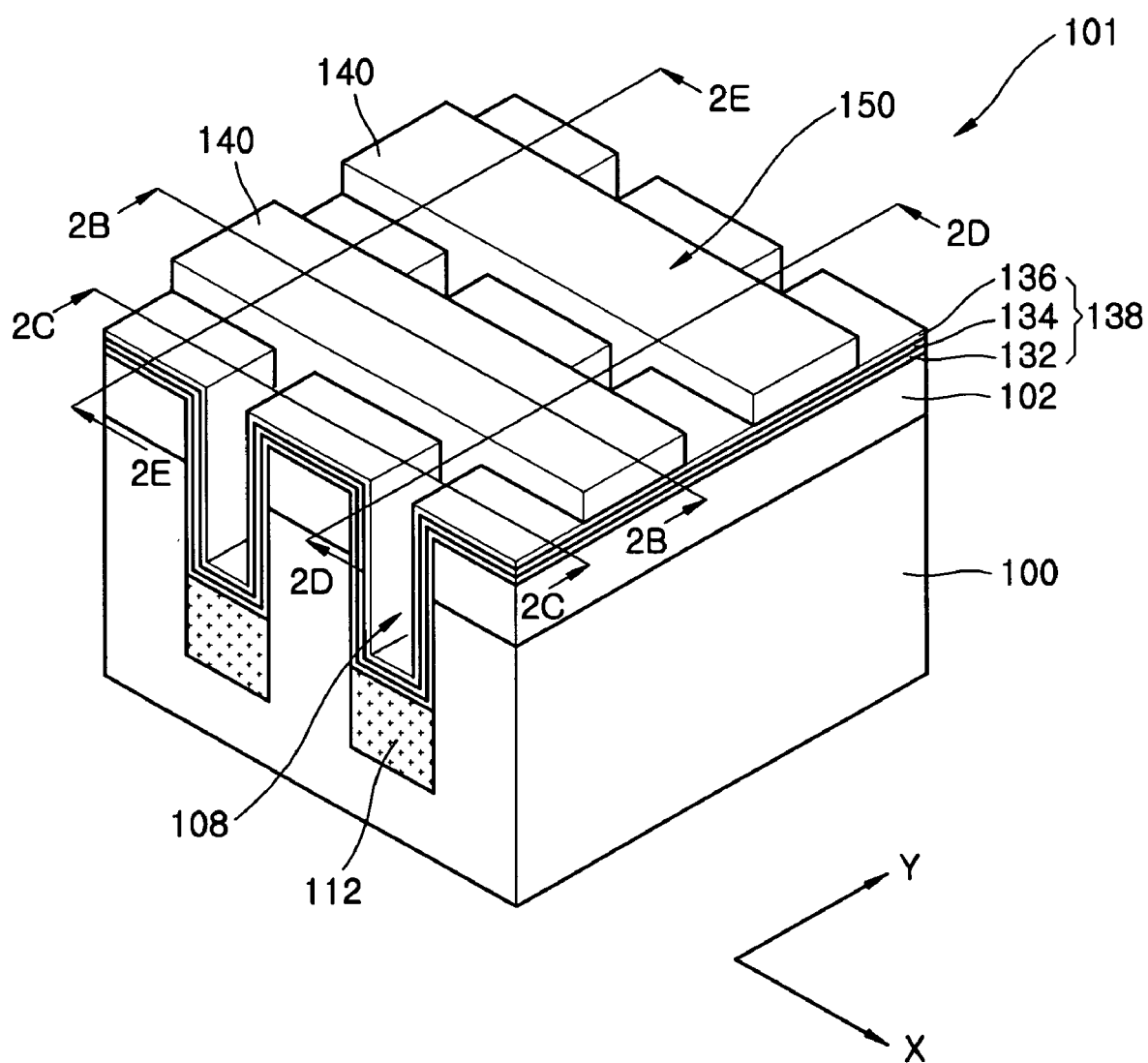
FIG. 2A is a perspective view of a non-volatile memory device with a SONOS structure having buried bit lines according to embodiments of the invention.

FIG. 2A is a perspective view of a non-volatile memory device with a SONOS structure having a buried bit line 102 according to embodiments of the invention. FIGS. 2B through 2E are sectional views respectively taken along lines 2B–2B, 2C–2C, 2D–2D and 2E–2E of FIG. 2A.

Figure 2B:
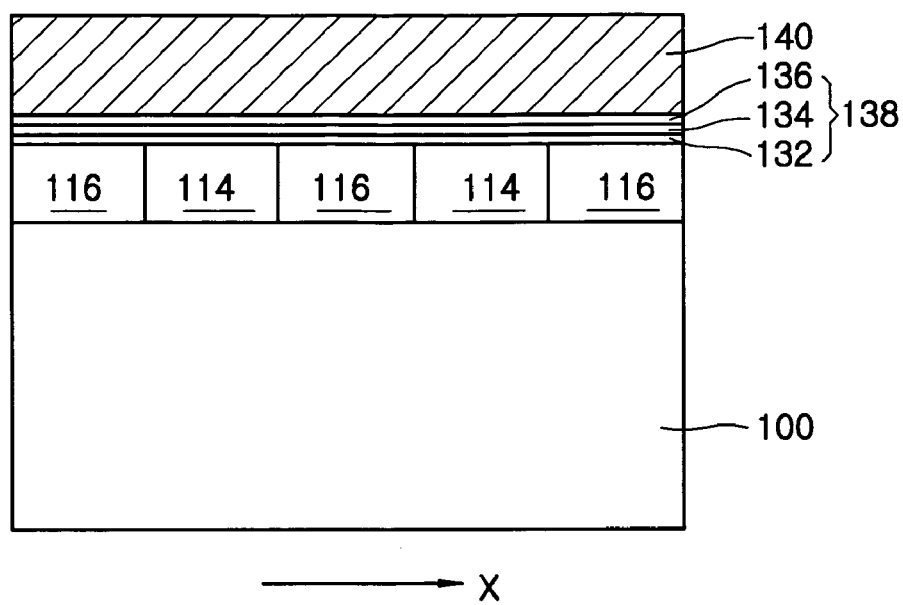
FIGS. 2B through 2E are sectional views respectively taken along lines 2B–2B, 2C–2C, 2D–2D and 2E–2E of FIG. 2A.
Figure 2C:
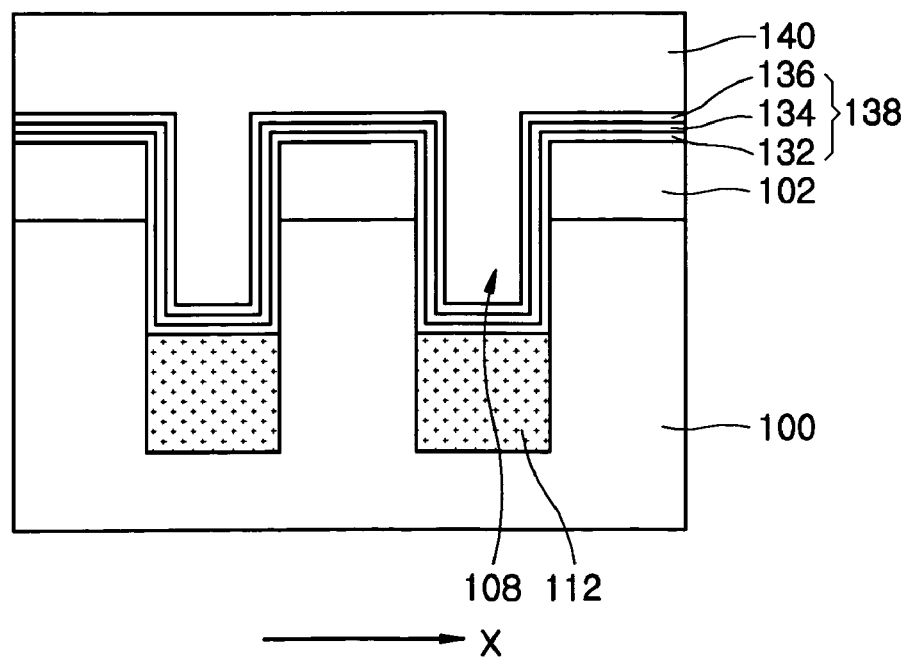

Referring to the embodiments of FIGS. 2A through 2E, a semiconductor memory device 101 having a plurality of unit memory cells is illustrated. Upper portions of a semiconductor substrate 100 are doped with an impurity of a first conductivity type, e.g., a P-type impurity, and contain the bit lines 102 doped with an impurity, e.g., an N-type impurity, of a second conductivity type opposite to that of the semiconductor substrate. The substrate 100 may comprise silicon, silicon-on-insulator (SOI) or any other suitable semiconductor substrate. The bit lines 102 may be spaced uniformly from one another and may extend in a first direction (e.g. Y-axis direction as indicated in FIG. 2A). In some embodiments, the net doping concentration of the bit lines 102 may exceed the net doping concentration of the substrate 100. As illustrated in FIG. 2C, the semiconductor substrate 100 may be patterned to form a plurality of spaced apart recess regions 108. The recess regions 108, which may be filled with device isolating layers (144 of FIG. 9), are formed between the bit lines 102. As described below, the device isolating layers 144 may reduce the possibility of an electrical short between adjacent channel regions 114 and/or between adjacent bit lines 102. As illustrated in FIG. 2B, regions of the bit lines adjacent the channel regions 114 form source/drain regions 116 of the unit cells of the semiconductor memory device.

Figure 2D:
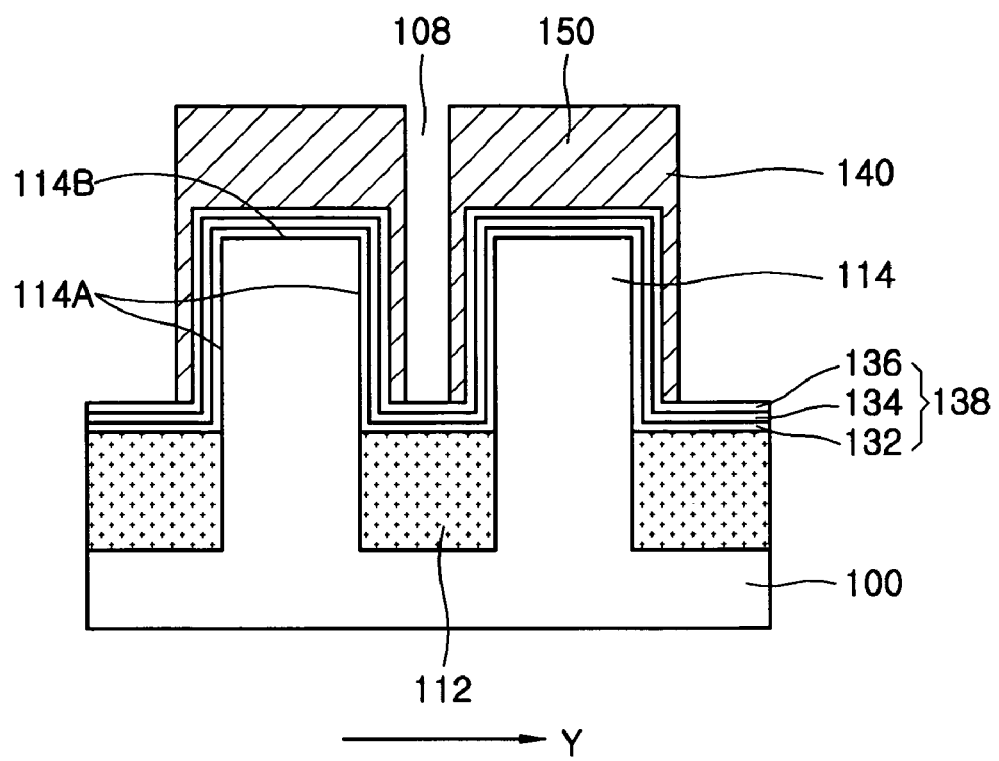

As illustrated in FIG. 2D, channel regions 114 may be formed along the first direction (the Y-axis direction) between the recess regions 108. By doing so, a recess region 108 and an adjacent channel region 114 form a pair that is repeated along the first direction (Y-axis direction). The channel regions 114 extend between adjacent bit lines 102. As further illustrated in FIG. 2D, the vertical dimensions of channel region 114 extend between the top of a second filling layer 112 at the bottom of the recess region 108 and the upper surface of the semiconductor substrate 100. Accordingly, each channel region 114 of the semiconductor device is shaped as a fin having opposing sidewalls 114A and an upper surface 114B as illustrated in FIG. 2D.

Figure 2E:
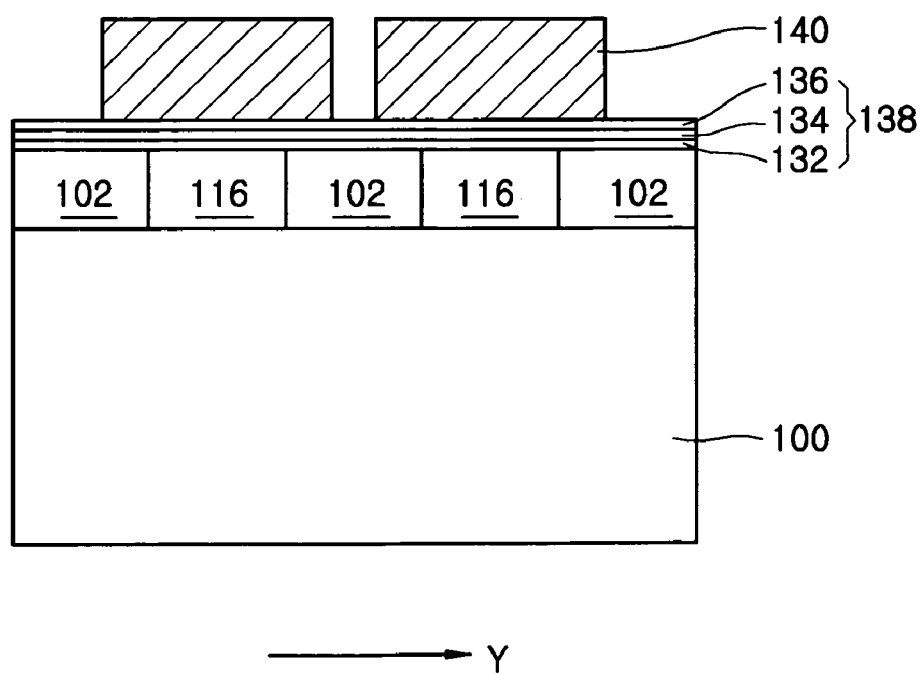

The channel regions 114 are covered with word lines 150 which may extend along a second direction (e.g. the X-axis direction), at right angles to the first direction (the Y-axis direction). The word line 150 includes a gate electrode layer 140, and an ONO layer 138 including a first oxide layer 132, a nitride layer 134 and a second oxide layer 136. In some embodiments, the word line 150 also covers the source/drain regions 116 formed in the bit line 102 between the channel regions 114 along the second direction (the X-axis direction). In other words, in some embodiments, the word line 150 covers both the channel region 114 and the source/drain regions 116. As shown in FIG. 2B, the gate electrode layer 140 may be formed on the ONO layer 138 over both the sidewalls 114A and the upper surface of the channel region 114B. Also, as illustrated in FIG. 2E, the gate electrode layer 140 may be formed over the upper surface of the source/drain regions 116 on which the ONO layer 138 is also formed.

FIGS. 3 through 9 are perspective views showing methods of manufacturing non-volatile memory devices with an ONO structure having a buried bit line 102 according to an embodiments of the invention.

Figure 3:
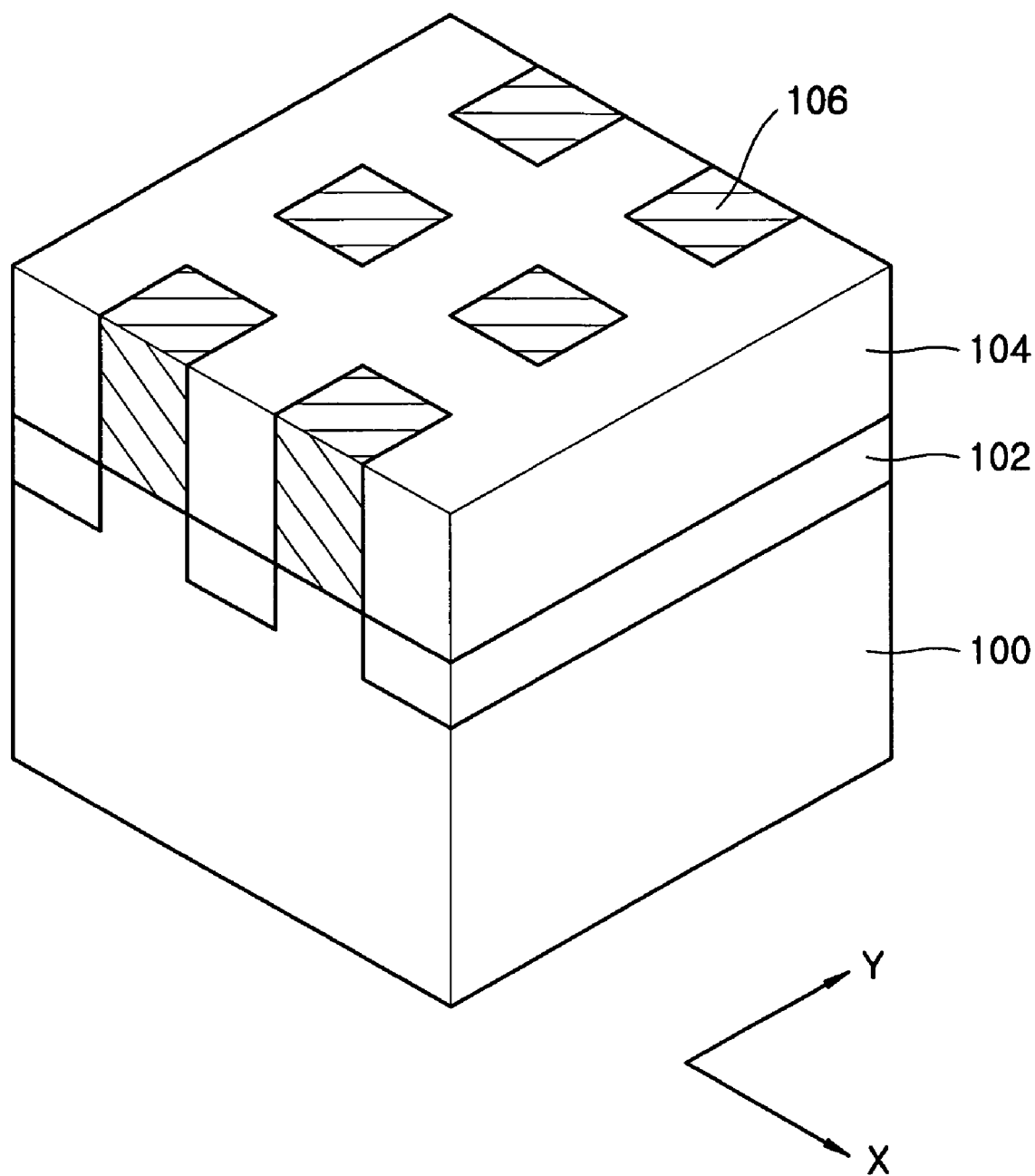
FIGS. 3 through 9 are perspective views showing methods of manufacturing a non-volatile memory device with a SONOS structure having buried bit lines according to embodiments of the invention.

Referring to the embodiments of FIG. 3, upper portions of a semiconductor substrate 100 may be doped with an impurity of a first conductivity type, e.g., a P-type impurity, and the bit lines 102 may be doped with an impurity, e.g., an N-type impurity of a second conductivity type opposite to that of the semiconductor substrate 100. In some embodiments, the net doping concentration of bit lines 102 may exceed the net doping concentration of substrate 100. A first mask layer 104 may be formed on the surface of the semiconductor substrate 100 where the bit lines 102 are located. A second mask layer 106 for defining a plurality of recess regions may be formed by a standard method on the first mask layer 104. In some embodiments, the first mask layer 104 may be a silicon oxide layer, and the second mask layer 106 may be a silicon nitride layer.

Figure 4:
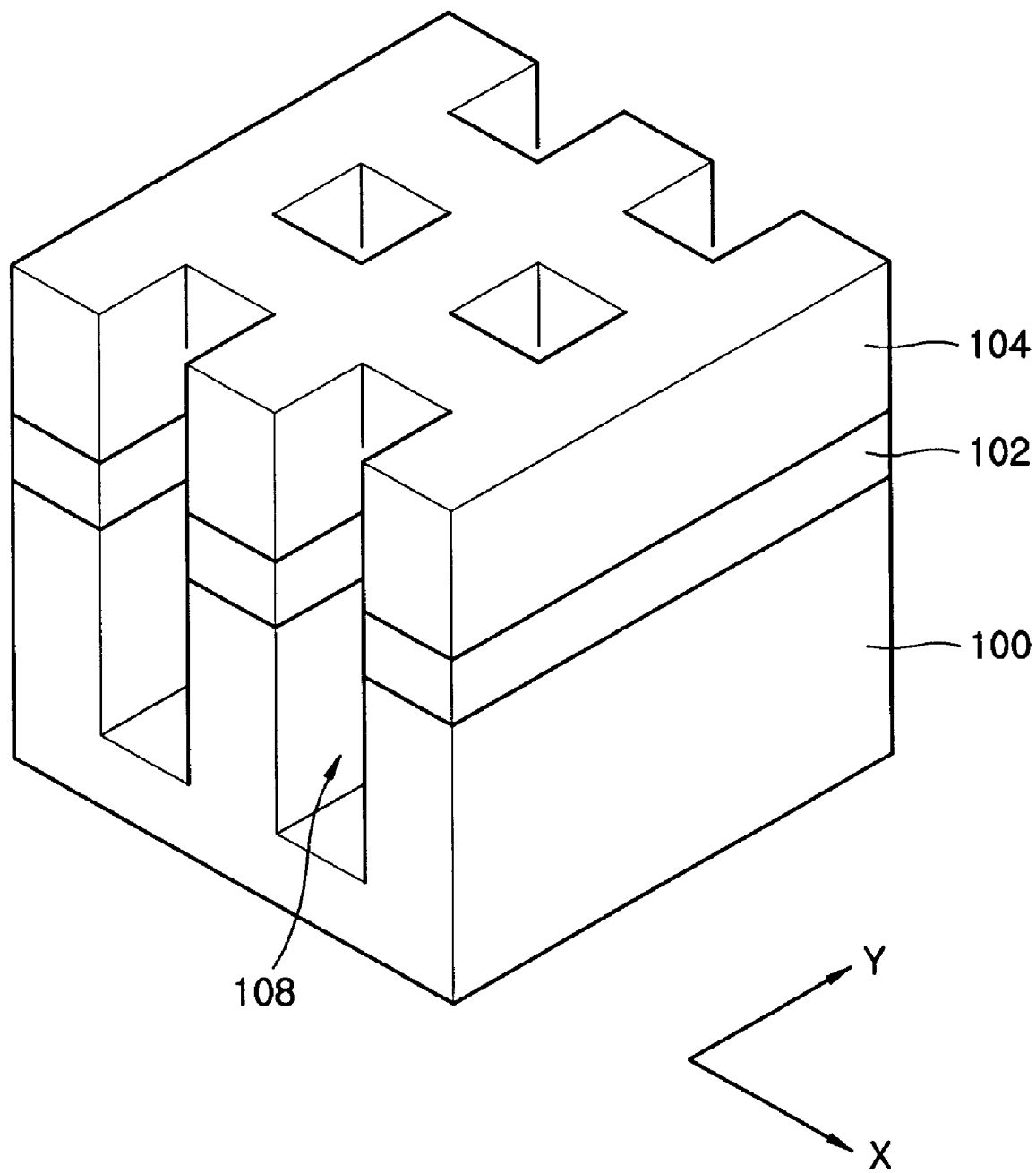

Referring to FIG. 4, the second mask layer 106 may be removed by a standard method using $H_3PO_4$ or similar. Thereafter, using the first mask layer 104 as an etch mask, the semiconductor substrate 100 may be partially etched in the shape of the second mask layer 106, thereby forming a plurality of recess regions 108. In order to obtain a desired etch profile, the recess regions 108 may be formed by a dry etching technique such as plasma etching or reactive ion etching.

In some cases, the recess regions 108 may be formed by other methods. For example, in some embodiments, a photoresist pattern (not shown) for defining the recess regions may be formed on the first mask layer 104. Then, portions of the first mask layer 104 and the semiconductor substrate 100 are partially removed in the shape of the photoresist pattern. However, since the photoresist pattern may be deformed during etching, the first mask layer 104 may be used as an etch mask.

Figure 5:
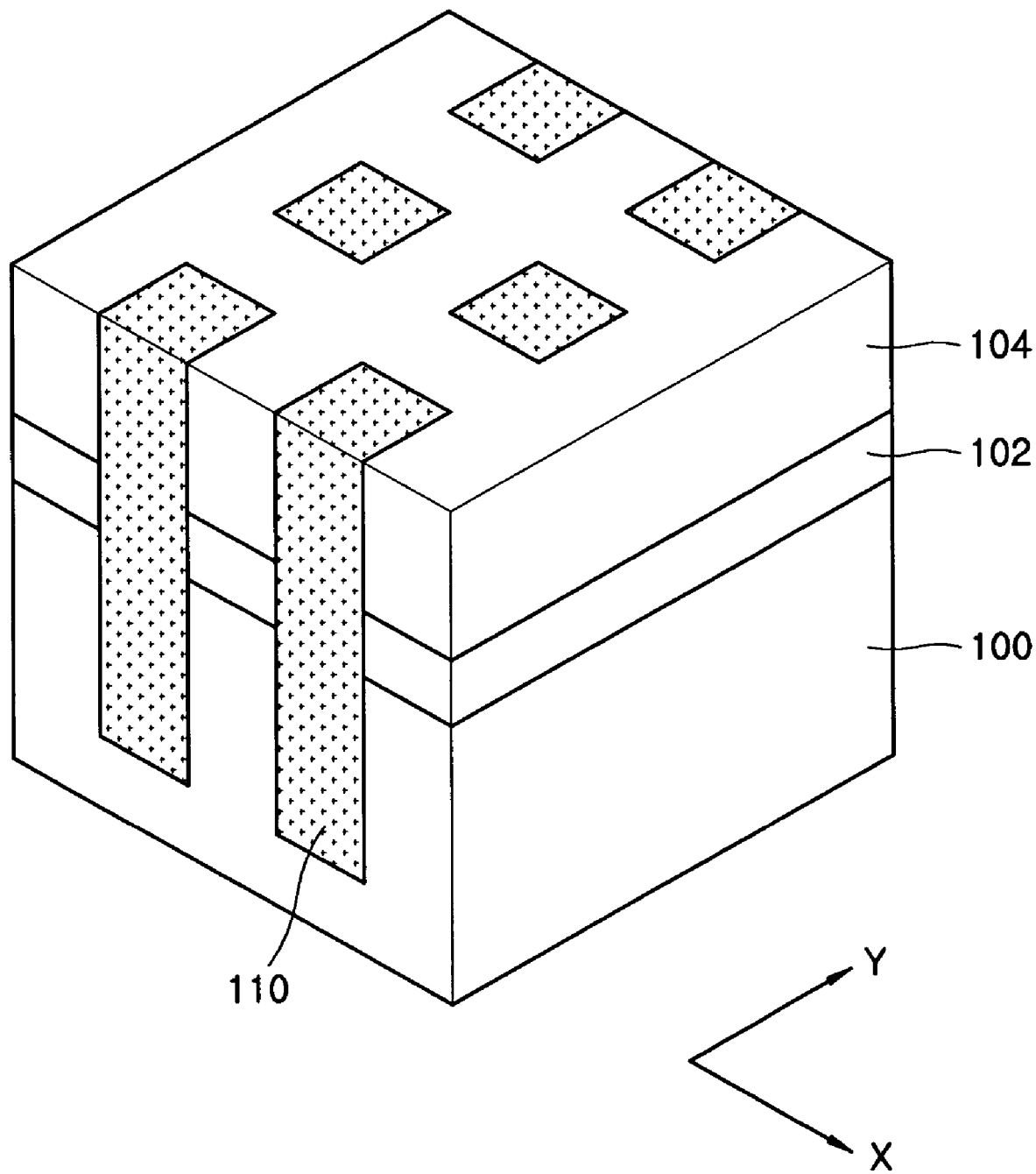

Referring to the embodiments of FIG. 5, the recess regions 108 may be filled with a first filling layer 110. In some embodiments, the first filling layer 110 may be a USG (Undoped Silicate Glass) layer, an HDP (High Density Plasma) oxide layer, a TEOS (tetraethylorthosilicate) layer formed using PECVD (Plasma Enhanced Chemical Vapor Deposition), an oxide layer formed using PECVD, or an insulating layer formed using a combination of any of such methods. In some embodiments, due to the dense structure of HDP oxides, an HDP oxide layer may be suitable for filling the recess regions 108.

HDP CVD is a combination of CVD and etching by sputtering in which a chamber is supplied with both a deposition gas for depositing a material layer and a sputtering gas for etching the deposited material layer by sputtering. Accordingly, $SiH_4$ and $O_2$ are supplied into a chamber as deposition gases, and an inert gas (e.g., Ar) is supplied into the chamber as a sputtering gas. The deposition gas and the sputtering gas are partially ionized by a plasma which is created within the chamber using a high frequency electric field. Because a wafer chuck (e.g., an electrostatic chuck) which holds the substrate in the chamber is supplied with a biased high frequency electric field, the ionized deposition gas ions and ionized sputtering gas ions are accelerated toward the surface of the substrate. The accelerated deposition gas ions form a silicon oxide layer, and the accelerated sputtering gas ions sputter the silicon oxide layer. As a result, the HDP oxide layer constituting the first filling layer 110 has a high density and good gap filling characteristics.

Figure 6:
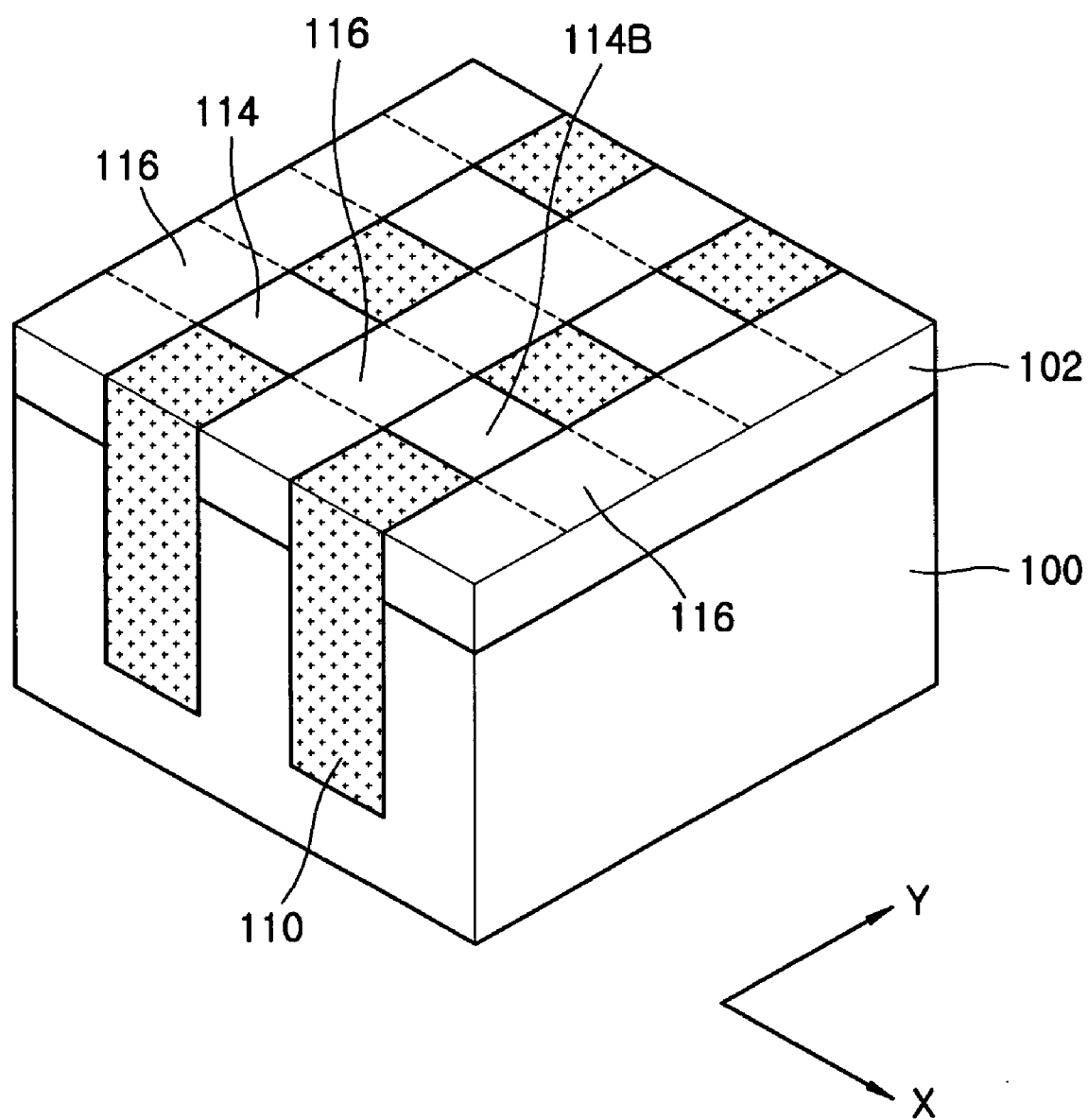

Referring to the embodiments of FIG. 6, the first layer 104 and portions of the first filling layer 110 are removed to expose the upper surface of the semiconductor substrate 100, which may then be planarized. Planarization may be performed using Chemical Mechanical polishing (CMP) or etchback. When planarization is finished, the upper surface 114B of the channel region 114 located in the semiconductor substrate 100 between the first filling layers 110 and the source/drain regions 116 disposed adjacent the channel regions 114 are exposed. The source/drain regions 116 refer to regions within the bit lines 102 adjacent the channel regions 114.

Figure 7:
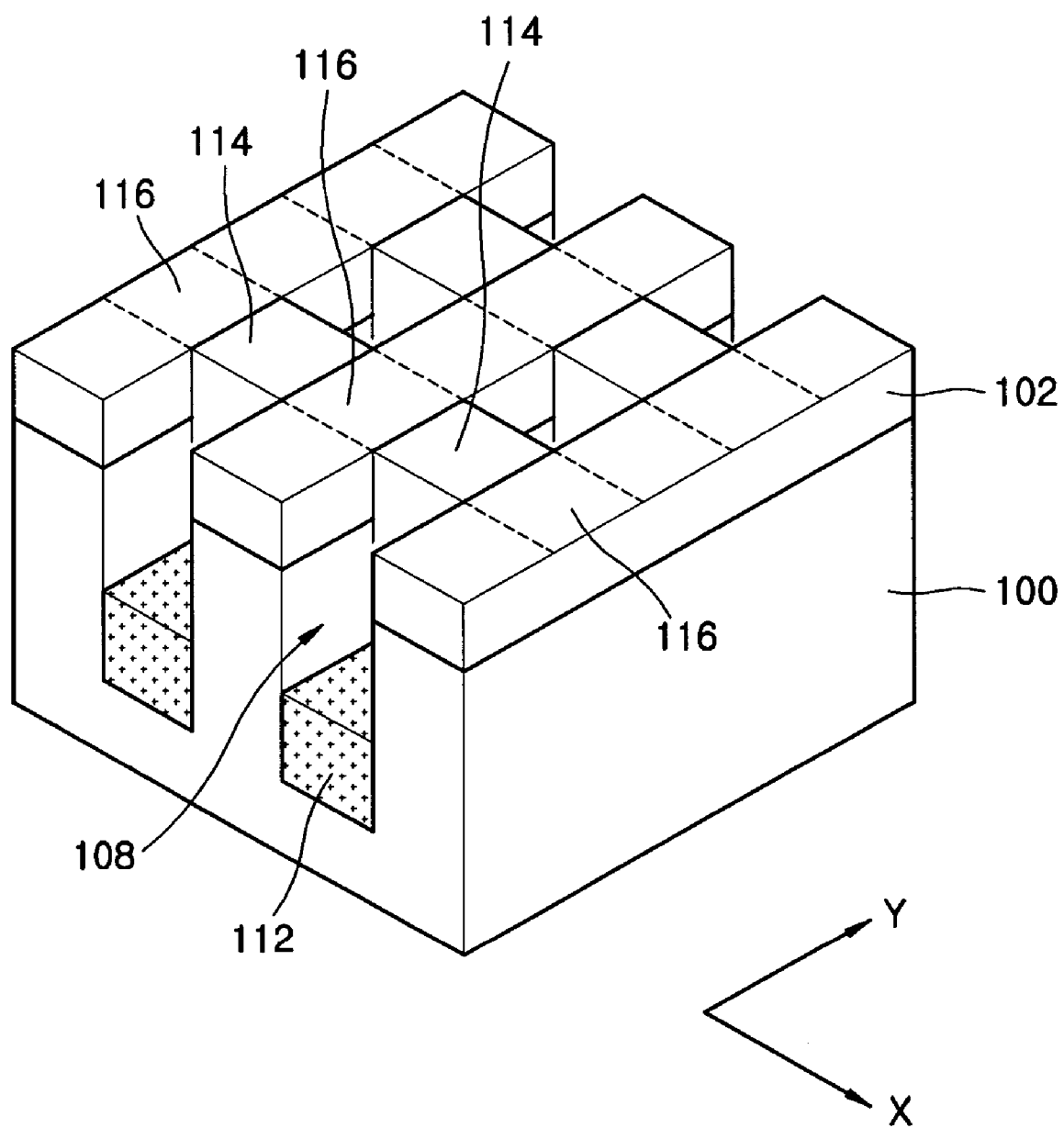

Referring to the embodiments of FIG. 7, the first filling layer 110 formed in the semiconductor substrate 100 is partially removed to form recess regions 108. Stated differently, by partially removing portions of first filling layer 110, a second filling layer 112 is formed that exposes the sidewalls 114A of the channel region 114. The amount removed from the first filling layer 110 may determine the channel width of the semiconductor device according to some embodiments of the invention. When the etched depth is small, the width of the channel region 114 may be decreased. Therefore, the amount of material removed from first filling layer 110 is selected based on the desired channel width of the channel regions 114. The first filling layer 110 may be removed by diluted HF, diluted $NH_4F$ or Buffered Oxide Etchant (BOE) which is a mixture of HF and deionized solution. The channel length of the channel regions 114 is determined by the spacing of adjacent bit lines 102.

Figure 8:
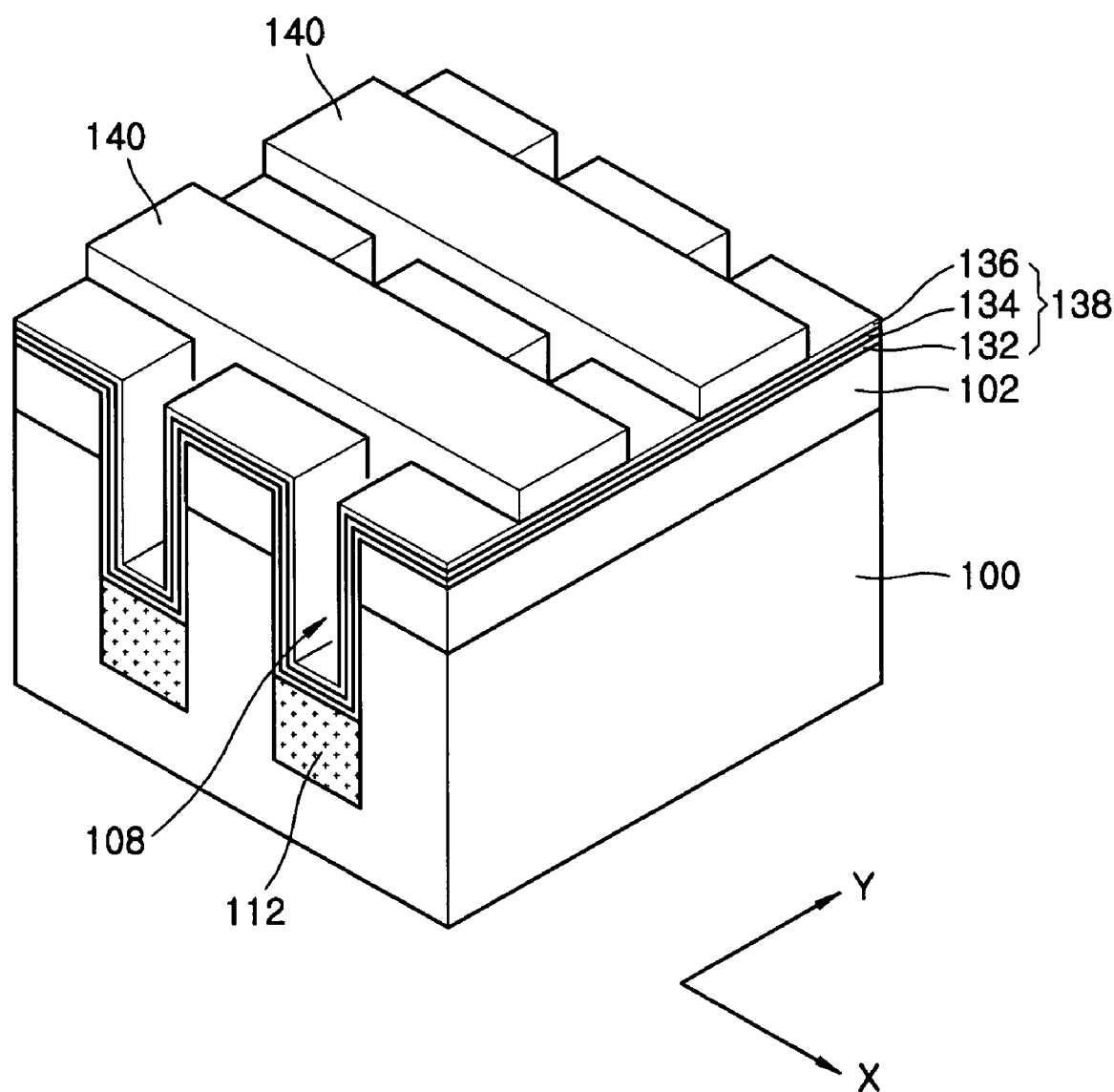

Referring to the embodiments of FIG. 8, an ONO layer 138, which in some embodiments may have a uniform thickness, is formed over the surface of the semiconductor substrate 100 and the second filling layer 112 via a blanket method. Thereafter, a gate electrode layer 140 is formed to cover the ONO layer 138 over sidewalls 114A, of the channel region 114, as well as the upper surface 114B of channel region 114. The gate electrode layer 140 may be patterned using the ONO layer 138 as an etch stop layer. More specifically, the gate electrode layer 140 may be formed by depositing a gate electrode material layer on the whole surface of the ONO layer 138. Then, a photoresist pattern for defining the gate electrode layer 140 is formed on the gate electrode material layer. The gate electrode layer 140 may be formed by etching the gate electrode material layer using the photoresist layer as an etch mask. In some embodiments, the ONO layer 138 may serve as an etch stop layer that prevents etching of the underlying material.

Figure 9:
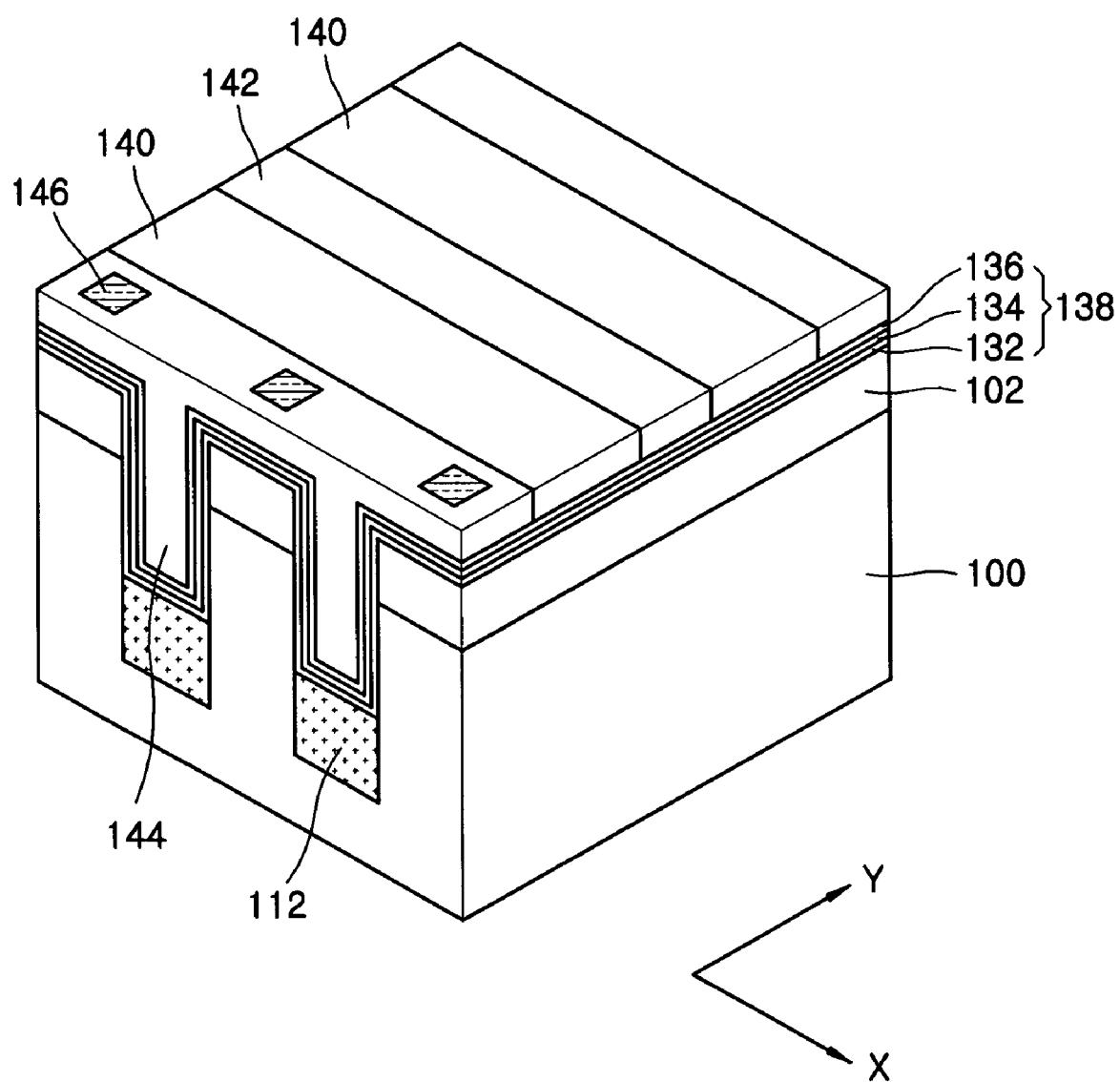

Referring to the embodiments of FIG. 9, after forming the gate electrode layer 140, an interlayer insulating layer 142 may be formed on the surface of the semiconductor substrate 100 and the gate electrode layer 140. The interlayer insulating material may include an HDP oxide. A bit line contact 146 may be formed in the second interlayer insulating layer 142 for providing external electrical connection to one end of a bit line 102. In some embodiments, the interlayer insulating layer 142 may fill the recess regions 108, thereby simultaneously isolating adjacent word lines 150 and adjacent bit lines 102. The device isolating layer 144 may be formed in the recess regions 108 to reduce the possibility of electrical shorts between adjacent channel regions 114 and/or adjacent bit lines 102.

Embodiments of the invention provide a semiconductor device having buried bit lines and methods of manufacturing the same. A device isolating layer for isolating adjacent buried bit lines and channel regions is formed by recessing a semiconductor substrate, thereby isolating conductive regions from one another.

Furthermore, in some embodiments of the invention the device isolating layer may be formed by recessing the semiconductor substrate so that fin-shaped channel regions are created, which may avoid or reduce the impact of certain short channel effects.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, a silicon oxide layer may be applied instead of ONO as the gate insulating layer.

What is claimed is:

1. A semiconductor device, comprising:
   a semiconductor substrate having a first conductivity type and having an upper portion;
   a pair of bit lines extending in a first direction, the pair of bit lines doped with an impurity of a second conductivity type opposite to the first conductivity type and spaced from one another in the upper portion of the semiconductor substrate;

a first line formed between the pair of bit lines and extending parallel to the bit lines, the first line comprising a plurality of alternating channel regions and recessed device isolation regions, each of the channel regions contacting each bit line of the pair of bit lines, wherein the recessed device isolation regions isolate the pair of bit lines from one another; and a plurality of word lines formed at right angles to the bit lines and covering the channel regions;

wherein each of the channel regions includes an upper surface proximate a word line of the plurality of word lines and a sidewall extending from the upper surface toward the substrate, the device further comprising an ONO layer on the sidewall and the upper surface of the channel regions, wherein the word lines are formed on the ONO layer.

2. The semiconductor device of claim 1, wherein first conductivity type is P-type and the second conductivity type is N-type.

3. The semiconductor device of claim 1, wherein the recessed isolation regions isolate adjacent pairs of channel regions from one another.

4. The semiconductor device of claim 1 wherein the ONO layer extends directly onto the upper surfaces of adjacent bit lines.

5. The semiconductor device of claim 1, wherein the recessed device isolation regions comprise HDP oxide.

6. The semiconductor device of claim 1, wherein the recessed device isolation regions extend into the substrate.

7. The semiconductor device of claim 1, further comprising:
an insulating layer formed in the recessed device isolation regions and covering surface portions of each of the bit lines.

8. The semiconductor device of claim 7, further comprising a bit line contact through the insulating layer for providing electrical contact to at least one of the bit lines.

9. The semiconductor device of claim 1, further comprising:
a filling layer partially filling each of the recessed device isolation regions, wherein the ONO layer is at least partially formed on the filling layer.

10. The semiconductor device of claim 9, wherein the filling layer comprises an HDP oxide, TEOS, USO or a PECVD oxide.

11. A semiconductor device, comprising:
a semiconductor substrate having a first conductivity type and having an upper portion;
at least one pair of bit lines extending in a first direction, the at least one pair of bit lines doped with an impurity of a second conductivity type opposite to the first conductivity type and spaced from one another in the upper portion of the semiconductor substrate;

a first line formed between the at least one pair of bit lines and extending parallel to the at least one pair of bit lines, the first line comprising a plurality of alternating channel regions and recessed device isolation regions, each of the channel regions contacting each bit line of the at least one pair of bit lines, wherein the recessed device isolation regions isolate the at least one pair of bit lines from one another; and a plurality of word lines formed at right angles to the bit lines and covering the channel regions;

wherein each of the channel regions includes an upper surface proximate a word line of the plurality of word lines and a sidewall extending from the upper surface toward the substrate, the device further comprising an ONO layer on the sidewall and the upper surface of the channel regions, wherein the word lines are formed on the ONO layer.

12. The semiconductor device of claim 11, wherein the recessed device isolation regions isolate adjacent pairs of channel regions from one another.

13. The semiconductor device of claim 11, wherein the ONO layer extends directly onto the upper surfaces of adjacent bit lines.

14. The semiconductor device of claim 11, wherein the recessed device isolation regions extend into the substrate.

15. The semiconductor device of claim 11, further comprising:
an insulating layer formed in the recessed device isolation regions and covering surface portions of each of the bit lines.

16. The semiconductor device of claim 15, further comprising a bit line contact through the insulating layer for providing electrical contact to at least one of the bit lines.

17. The semiconductor device of claim 11, further comprising:
a filling layer partially filling each of the recessed device isolation regions, wherein the ONO layer is at least partially formed on the filling layer.

* * * * *

UNITED STATES PATENT AND TRADEMARK OFFICE
CERTIFICATE OF CORRECTION

PATENT NO. : 7,227,220 B2  Page 1 of 1
APPLICATION NO. : 11/240544
DATED : June 5, 2007
INVENTOR(S) : Kim et al.

It is certified that error appears in the above-identified patent and that said Letters Patent is hereby corrected as shown below:

Column 9, Claim 10, Line 44: Please correct "USO"
To read -- USG--

Signed and Sealed this

Eighteenth Day of September, 2007

JON W. DUDAS
*Director of the United States Patent and Trademark Office*